United States Patent [19]
Dixon

[11] Patent Number: 5,614,826
[45] Date of Patent: Mar. 25, 1997

[54] METHODS FOR PREPULSING IN NUCLEAR MAGNETIC RESONANCE PULSE SEQUENCING

[75] Inventor: W. Thomas Dixon, Atlanta, Ga.

[73] Assignee: Emory University, Atlanta, Ga.

[21] Appl. No.: 515,679

[22] Filed: Aug. 18, 1995

[51] Int. Cl.$^6$ ........................................ G01V 3/00
[52] U.S. Cl. ............................ 324/307; 324/309
[58] Field of Search ........................... 324/300, 307, 324/309, 308, 314

[56] References Cited

U.S. PATENT DOCUMENTS

| | | | |
|---|---|---|---|
| 5,262,724 | 11/1993 | Tanttu | 324/307 |
| 5,270,652 | 12/1993 | Dixon et al. | 324/309 |
| 5,281,917 | 1/1994 | Santyr | 324/309 |
| 5,347,217 | 9/1994 | Leach et al. | 324/307 |
| 5,378,985 | 1/1995 | Hinks | 324/307 |

OTHER PUBLICATIONS

Friedrich, Jan O., Frequency and Spatial Selectivity in Nuclear Magnetic Resonance Spectroscopy, University of Oxford (United Kingdom), vol. 50–09B, 1988, p. 4066; Abstract.

Eberhardt, K. E. W., et al., 3D–MR Myelography (3D–MRM) for the Diagnosis of Lumbal Nerve Root Compression Syndrome. A Comparison with Conventional Myelography, *Aktuelle Radiologie* (Germany), Neuroradiologische Abstract, vol. 4, No. 6, pp. 313–317, 1994–11, Abstract.

Edelman, R. R., et al., Breath–hold MR Angiography of Human Coronary Arteries – EDB, *Seventy Seventh Assembly and Annual Meeting of the Radiological Society of North America*; pp. 97–98, 1991, Abstract.

Henrich, D., et al., Three–Dimensional MR Movies – EDB, *Seventy Sixth Scientific Assembly and Annual Meeting of the Radiological Society of North America*, p. 186, 1990, Abstract.

Skalej, M., et al., Snapshot MR Imaging, Dynamic Motion Study of Stomach Peristalsis, *Proceedings of the 75th Anniversary Scientific Assembly and Annual Meeting Radiological Society of North America*, p. 412, 1989, Abstract.

Icenogle, M.V., et al., Mapping Flow Streamlines by Multistripe Tagging – INS, *Journal of Magnetic Resonance*, vol. 100, No. 2, pp. 376–381, Nov. 1992, Abstract.

Connelly, A., et al., Outer Volume Suppressed Image related in Vivo Spectroscopy (OSIRIS), a High–Sensitivity Localization Technique, *Journal of Magnetic Resonance*, vol. 78, No. 3, pp. 519–525, Jul. 1988, Abstract.

(List continued on next page.)

Primary Examiner—Louis M. Arana
Attorney, Agent, or Firm—Kilpatrick & Cody, L.L.P.

[57] ABSTRACT

A composite spin lock prepulse method compensates for magnetic field inhomogeneities in objects or materials under study using nuclear magnetic resonance (NMR). The effective magnetic field seen by an object or material under study using NMR often is characterized by an off-resonance component, which results in the magnetization of the object or material having a component that diverges from the intended orientation after RF pulses. The method according to the present invention recognizes and utilizes the observation that aligning the off-resonance component of the magnetization in the x-z plane can be achieved when the amplitude of a preceding 90° y flip pulse is known, and that the effective field can be placed in alignment with the resulting magnetization, if necessary or desired, by adjusting the amplitude of the locking pulse as a function of the amplitude of the flip pulse. The method has been found to be particularly useful for enhancing contrast in images obtained using magnetic resonance imaging (MRI), and it may be conveniently applied in this and a wide variety of other NMR applications because pulse sequences of the present invention can be conveniently be inserted into existing NMR pulse sequences. In addition, the method may be used to create prepulse sequences having reduced net effective field amplitude and, thus, reduced SAR (heat absorption).

23 Claims, 8 Drawing Sheets

OTHER PUBLICATIONS

Friedrich, J. and R. Freeman, Spatial Localization Using a 'Straddle Coil', *Journal of Magnetic Resonance*, vol. 77, No. 1, pp. 101–118, Mar. 1988, Abstract.

Shaka, A.J. and R. Freeman, 'Prepulses' for Spatial Localization, *Journal of Magnetic Resonance*, vol. 64, No. 1, pp. 145–150, Aug. 1985, Abstract.

Richards, P.M., et al., Nuclear–Magnetic–Resonance Echo Enhancement in an Antiferromagnet, *Physical Review B(Solid State)*, vol. 4, No. 7, pp. 2216–2224, Oct. 1, 1971, Abstract.

Eberhardt, K.E., et al., 3D–MR Myelography in Diagnosis of Lumbar Spinal Nerve Root Compression Syndromes. Comparative Study With Conventional Myelography?, *Aktuelle, Radiol*, vol. 4, No. 6, pp. 313–317, Nov. 1994, Abstract.

Tanigawa, K., et al., Magnetic Resonance Imaging Detection of Aortic and Pulmonary Artery Wall Thickening in the Acute Stage of Takayasu Arteritis. Improvement of Clinical and Radiologic Findings After Steroid Therapy, *Arthritis Rheum.*, vol. 35, No. 4, pp. 476–480, Apr. 1992, Abstract.

Seelos, K.C., et al., MR Aniography of Congenital Heart Disease: Value of Segmented Two–Dimensional Inflow Technique and Maximum–Intensity–Protection Display, *J. Magn. Reson. Imaging*, vol. 4, No. 1, pp. 29–36, Jan.–Feb. 1994, Abstract.

Vandenberg, J.I., et al., Intracellular pH Recovery During Respiratory Acidosis in Perfused Hearts, *Am. J. Physiol*, vol. 266, No. 2, Pt. 1, pp. C489–497. Feb. 1994, Abstract.

Grace, A.A., et al., Regulation of Intracellular pH in the Perfused Heart by External $HCO3-$ and $Na(+)-H+$ Exchange, *Am. J. Physiol*, vol. 265, No. 1, Pt. 2, pp. H289–298, Jul. 1993, Abstract.

Wilke, N., et al., Contrast–Enhanced First Pass Myocardial Perfusion Imaging: Correlation Between Myocardial Blood Flow in Dogs at Rest and During Hyperemia, *Magn. Reson. Med.*, vol. 29, No. 4, pp. 485–497, Apr. 1993, Abstract.

Klose, U., Mapping of the Radio Frequency Magnetic Field with a MR Snapshot FLASH Technique, *Med. Phys.*, vol. 19, No. 4, pp. 1099–1104, Jul.–Aug. 1992, Abstract.

Chien, D., et al., High–Speed Black Blood Imaging of Vessel Stenosis in the Presence of Pulsatile Flow, *J. Magn. Reson. Imaging*, vol. 2, No. 4, pp. 437–441, Abstract.

Matthaei, D., et al., Fast Inversion Recovery T1 Contrast and Chemical Shift Contrast in High–Resolution Snapshot FLASH MR Images, *Magn. Reson. Imaging*, Vo. 10, No. 1, pp. 1–6, 1992, Abstract.

Bensal, N. and R. L. Nunnally, Improved MR Imaging in Extremely Inhomogeneous Radio–Frequency Fields, *Magn. Reson. Imaging*, vol. 9, No. 1, pp. 61–65, 1991, Abstract.

Anderson, S.E., et al., Na–H Exchange in Myocardium: Effects of Hypoxia and Acidification on Na and Ca., *Am. J. Physiol.*, vol. 259, No. 6, Pt. 1, C940–8, Dec. 1990, Abstract.

Henrich, D., et al., 3–D snapshot Flash NMR Imaging of the Human Heart, *Magn. Reson. Imaging*, vol. 8, No. 4, pp. 377–379, 1990, Abstract.

Bourgeois, D., et al., High–Flux Signals and Spatial Localization in High–Resolution 1H Spectroscopy with Surface Coils, *Magn. Reson. Med.*, vol. 11, No. 2, pp. 275–281, Aug. 1989, Abstract.

Ordidge, R. J., et al., A General Approach to Selection of Multiple Cubic Volume Elements Using the ISIS Techniqu, *Magn. Reson. Med.*, vol. 8, No. 3, pp. 323–331, Nov. 1988, Abstract.

Ordidge, R. J., Randon Noise Selective Excitation Pulses, *Magn. Reson. Med.*, vol. 5, pp. 93–98, No. 1, Jul. 1987, Abstract.

Purdy, David E., "Method for 3–D Magnetic Resonance Imaging", Patent 5,180,981, Patent application No. 616522 filed Nov. 21, 1990, patent date Jan. 19, 1993, Abstract.

Ehman, R.L. and J. P. Felmlee, Method for Reducing Artifacts in NMR Images, Request for Reexamination No. 90/003,739, Feb. 21, 1995; B1,4,715,383 (2708th); Reexamination Certificate for Patent 4,715,383 issued Dec. 29, 1987.

Freeman, R., et al., Radiofrequency Pulse Sequences Which Compensate Their Own Imperfections, Physical Chemistry Laboratory, Oxford, England, Received Sep. 13, 1979, *Journal of Magnetic Resoance* 38, 453–479 (1980).

Levitt, M.H., Composite Pulses, *Progress in Nuclear Magnetic Resonance Spectroscopy*, vol. 18, pp. 61–122, 1986.

Principles of MR Imaging, Phillips, *Medical Systems*, pp. 9–65.

Santyr, G. E., et al., Off–Resonance Spin Locking for MR Imaging, *Departments of Medical Physics and Radiology, University of Wisconsin*, Madison, Wisconsin, received Jul. 6, 1993, revised Dec. 21, 1993, accepted Mar. 15, 1994, pp. 43–50.

Cardiac Magnetic Resonance Imaging – A Philips Medical Systems Clinical Applications Series, *Basic Principles*, MR Clinical Application Series, Philips, pp. 2–15.

Brittain, Jean H., et al., Coronary Angiography with Magnetization–Prepared $T_2$ Contrast, *Magnetic Resonance Systems Research Laboratory, Stanford University*, MRM 33:689–696 (1995).

Parrar, Thomas C., Pulse Nuclear Megnetic Resonance Spectroscopy – An Introduction to the Theory and Applications, Department of Chemistry, University of Wisconsin, Madison, Wisconsin, Preface, The Parragut Press, Chicago, 1987.

Sepponen, R.E., et al., Multiple Slice Spin Lock Sequence – An Effective Method for $T1_p$ Imaging, *Soc. Mag. Res. Med.*, p. 1218, 1993.

Brittain, J.H., et al., Multislice Coronary Agiography with Muscle and Venous Suppression, *Department of Electrical Engineering, Stanford University*, p. 367.

Dixon, W.T., et al., Selective Myocard Suppression by Spin–Locking with a Compensated Prepulse Increases Contrast in Cine Image, *Magnetic Resonance Scientific Meeting*, Venice, France, 1995.

Dixon, W.T., A Spin–Locking BO Compensated Prepulse Increases Cine Cardiac Image Contrast, 1995 cientific Paper, RSNA *Research Trainee Prize Abstracts*, Radiological Society of North America, p. 48, 1995.

Simple Spin-Lock  90y-lockx-90(-y)

FIG. 13

Composite Spin-Lock  90y-135x-lockx-135x-90(-y)

METHODS FOR PREPULSING IN NUCLEAR MAGNETIC RESONANCE PULSE SEQUENCING

FIELD OF THE INVENTION

The present invention pertains in general to the field of nuclear magnetic resonance ("NMR") and, in particular, to NMR pulse sequencing.

BACKGROUND OF THE INVENTION

Many subatomic particles, including certain atomic nuclei, are characterized by an angular momentum or spin. A spinning nucleus, commonly referred to simply as a "spin," is susceptible to disturbance when under the influence of fluctuations in the electromagnetic field. If a magnetic field $H_0$ is imposed upon a "lattice" (a commonly accepted term for an aggregation of particles undergoing study), the spins, which constitute magnetic moments, tend to orient or align themselves with $H_0$. Moreover, the spins precess about the direction of this field according to a phenomenon known as "Larmor Precession." Larmor precession occurs at a frequency— "the Larmor frequency" —that is proportional to the magnitude of the applied field.

If field $H_0$ is disturbed, the field alignment of the spins that constitute the lattice is also disturbed. This effect is particularly evident when field $H_0$ is disturbed by an RF field bearing a relationship to the Larmor frequency of the lattice. As with systems generally, a lattice most easily absorbs energy at its own characteristic or resonant frequency, the Larmor frequency. The absorption of energy from an oscillating field $H_1$ by a lattice that is already under a magnetic field $H_0$ leads the spin axes to precess about the magnetic field resulting from the combination of $H_1$ and $H_0$. Such shifting or flipping is most efficiently accomplished by the application of a field $H_1$ that is polarized in a plane orthogonal to $H_0$ and which rotates at the Larmor frequency.

Observations of shifting or flipping of spins following the cessation of field $H_1$ have revealed that the spins return to the ground state associated with $H_0$ according to two first order relaxation processes. Prior to fully relaxing to their ground states, the spins produce electromagnetic signals having characteristics that are capable of detection, and from which inferences of enormous practical importance can be drawn. Such signals provide the basis for generating NMR images of human organs, for example.

Figure 1:
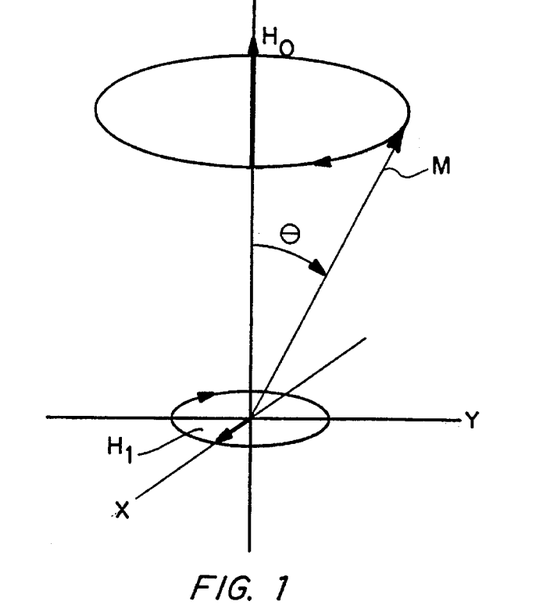
FIG. 1 shows a spin under the influence of magnetic fields $H_0$ and rotating $H_1$ in a three dimensional frame.
Figure 2:
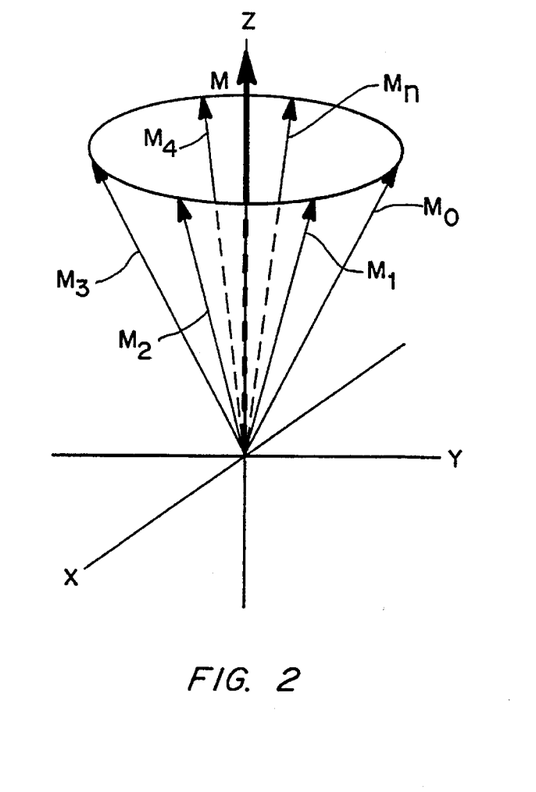
FIG. 2 shows a set of spins in a three dimensional frame and a resulting net magnetization M.

The behavior of nuclear spins in magnetic fields as described above is illustrated in FIGS. 1–3. A lattice (not shown) may placed for study in a magnetic field $H_0$ oriented in the z direction of a three dimensional reference frame (x, y, z). This and other magnetic fields necessary for conducting NMR analyses may be generated by a Philips Medical Systems (Best, Netherlands) Gyroscan NT®, or other suitable device manufactured by various vendors, including the General Electric Company, Inc., and Siemens A.G. Under the influence of field $H_0$, a spin, $\mu$, of the lattice precesses about $H_0$ and the z axis. Absorption by a particular spin $\mu$ of energy from a rotating field $H_1$ tips the spin away from $H_0$ by an amount $\theta$, but it does not affect the rate of precession. This precession-rate occurs at the Larmor frequency, and is thus given by the Larmor equation:

$$v = -\gamma H_0 / 2\pi \text{(Hz)}$$

where $\lambda$ is the magnetogyric ratio, a constant for a particular spin. Clearly, it would be intractable to track the behavior of particular spins. Instead, as shown in FIG. 2, one can identify a macroscopic or net magnetization M, representing an aggregate magnetization for the spins ($\mu_0$, $\mu_1$, $\mu_3$, $\mu_4$, ... $\mu_n$) in the lattice of interest. The net magnetization M provides a convenient entity to which one can refer in respect of the behavior of the lattice as a whole. In the most simple case, when magnetic field $H_0$ is applied in the z direction, magnetization M is also oriented in the z direction, about which the spins of the lattice precess. This case is illustrated in FIG. 2.

Figures 3, 4, 5:
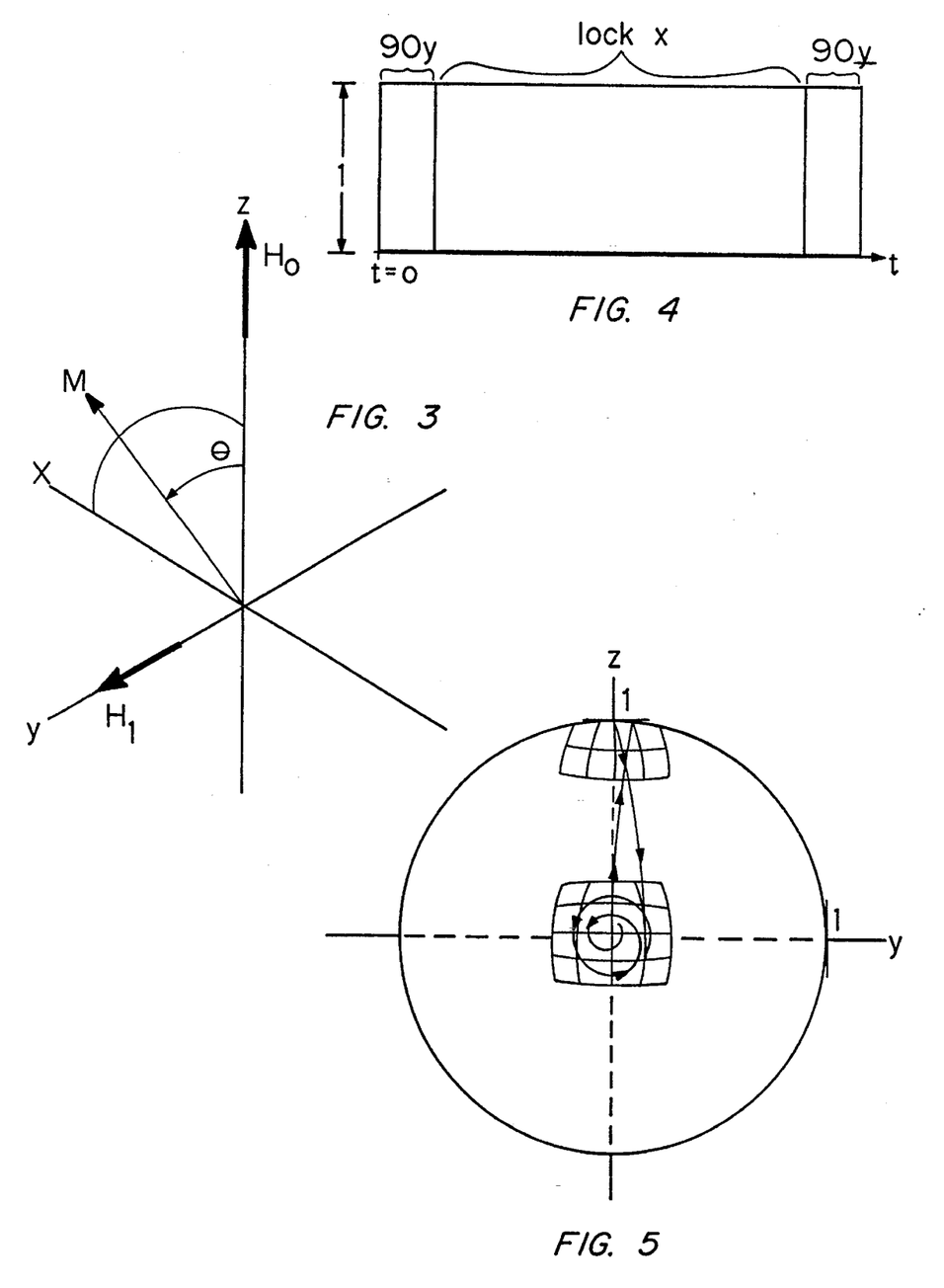
FIG. 3 shows a net magnetization M in a three dimensional frame under a magnetic field $H_0$ in the z direction and subject to RF magnetic field $H_1$ along the y axis, the latter causing the magnetization M to precess toward the x axis.
FIG. 4 shows a known spin-lock prepulse sequence method.
FIG. 5 shows a unit sphere, as viewed along the x axis on which is visible the track of the trajectory of a magnetization under the spin-lock prepulse method shown in FIG. 4, grids being superimposed at points of particular interest.

That the orientation of magnetization M and the axis of precession of the spins of a lattice vary according to fluctuations in the electromagnetic field implies that the axis of precession can be intentionally manipulated. More particularly, the application of an RF field $H_1$ in a given direction imposes a torque along that direction and according to the well-known right hand rule. As shown in FIG. 3, a field $H_1$ in the y direction imposes a torque on M that causes it to rotate away from z and about the y axis. The rate of this migration is linearly dependent upon the magnitude of the applied field. This behavior is predicted by the Bloch equation:

$$dM/dt = \gamma M \times B.$$

The RF field $H_1$ may be circularly or linearly polarized in the x-y plane and rotated at the Larmor frequency in order to impart energy to the spins, and thereby rotate their axes of precession. The Larmor frequency, however, may be in the neighborhood of millions of cycles per second (Megahertz or Mhz). The resulting disturbance of the spins, which are initially spinning and precessing about z, is accordingly rather complicated and difficult to track. This difficulty can be overcome, however, by the adoption of a frame of reference (or, simply, a frame) that rotates about z in the same direction and at the same rate that the field $H_1$ rotates. This coordinate system is commonly known as "the rotating frame" and is to be contrasted with a static (or laboratory) frame. The reader may analogize the rotating frame in the nuclear spin context to a rotating frame that every human being implicitly employs at every moment. A common example of a rotating frame continuously (although perhaps unwittingly) employed by everyone at every moment treats the surface of the earth and its objects as fixed, rather than rotating every 24 hours and translating with a velocity of over 1000 miles per hour. The perception of motion is suppressed by recognizing only a reference frame that rotates with respect to inertial space at a rate of once a day.

The motion of the magnetization vector M in a magnetic field H in the rotating frame is given by the following equation:

$$(dM/dt)_{rot} = \gamma M \times H - \omega \times M$$

This equation can be rewritten as:

$$(dM/dt)_{rot} = \gamma M \times H_{eff}$$

where $$H_{eff} = H + \omega/\gamma$$

These equations state that the change in the magnetization with time as viewed within the rotating frame varies linearly with the product of the magnetization and an effective magnetic field $H_{eff}$, and that this effective field $H_{eff}$ is the sum of the magnetic field H plus the rotational (angular) velocity divided by the magnetogyric ratio. The effective magnetic field $H_{eff}$ is simply equal to $H_1$, if $H_1$ and the rotating frame are at resonance with the Larmor frequency of the spins. The effective field $H_{eff}$ differs from $H_1$ if it is "off-resonance." An off-resonance condition can result from practical limitations on the degree to which magnetic fields can be controlled and made uniform. This non-uniformity, and the off-resonance $H_{eff}$ to which it gives rise, represent the core of the problem solved by the present invention.

When a magnetization M and the associated spin precessions under a field $H_0$ are exposed to a resonant RF field $H_1$ in the direction of the positive x-axis, it begins to move or "flip" down toward the positive y-axis. Upon cessation of an applied field, the spins transfer energy to their surroundings, with respect to which they return to equilibrium, and turn back toward the z direction under $H_0$. This first order relaxation process is characterized by two quantities: a time constant $T_1$, known as the "longitudinal" or "spin-lattice relaxation time," in which spins transfer energy to the lattice; and a time constant $T_2$, known as the "transverse" or "spin-spin relaxation time," according to which spins transfer energy to each other. When the relaxation of the magnetization M is along the magnetization, it is characterized by $T_1$. If M relaxes when it is aligned with $H_{eff}$ in a rotating frame, it is characterized by the $T_{1\rho}$ ($\rho$, the Greek letter r, signifying the rotating frame).

Although nuclear magnetic resonance (NMR) can be observed in several ways, one commonly used approach uses short bursts or pulses of RF power at a discrete frequency. Called, pulse methods or free precession techniques, they involve the observation of a nuclear spin system after the RF is shut off.

"Spin locking" is one useful technique for reducing effects of inhomogeneity in $H_0$. In short, spin locking first applies a pulse to rotate M about a particular axis, say the y axis, by applying $H_1$ in form of a 90° pulse in the y direction. As shown in FIG. 3, M has rotated an angle θ about the y axis and towards the x axis. Once the 90° pulse is completed, a 90° phase change in $H_1$ has been effected, so that $H_1$ points along the x axis, collinear with M. With $H_1$ lying along the same line as M, the former applies no torque on the latter and M is held in position or "locked" on the x axis. This locking process, and the knowledge of characteristic values for $T_{1\rho}$ for various types of materials, permit $T_{1\rho}$ to serve as the basis for certain imaging techniques and other analytical methods.

A conventional short hand notation summarizes the pulses in a sequence in the following form:

*Ai-lockj-Ai,* where: (1) a first pulse causes a "flip down" rotation having an angular magnitude A about an axis i; (2) a locking pulse aligned along j, the axis of magnetization at the end of step 1, is applied to maintain the magnetization in that direction; and (3) a negative "flip back" rotation of magnitude A is applied about the i axis (negative direction or 180° phase shift indicated by underscore). In the absence of off-resonance or other errors, the set of pulses in the above sequence should return the magnetization to alignment with an axis, along which it was aligned prior to the pulse sequence.

Known spin-locking and flip back techniques, however, tend to lock the magnetic field inefficiently and to place the magnetization M at a location that is imprecisely known. This imprecision arises from the existence of a deviation or off-resonant component, $\epsilon$, (also referred to here as resonance offset) between the direction of the effective magnetic field $H_{eff}$ and the intended direction of that field. This off-resonance component in turn results from spatial variations in the primary magnetic field $H_0$. An undesired result of imprecision in directing the magnetization and spin lock inefficiency is that they can undermine imaging or other processes, the quality of which depends on the efficiency of the lock and the accuracy with which the direction of M is known.

An example of a known prior art spin lock technique is shown in FIGS. 4–6B and 13. (See Brief Description of the Drawings, below). FIG. 4 shows the pulse sequence 90y-lockx-90y. The horizontal axis in FIG. 4 measures time, while the vertical axis measures the amplitude of $H_1$. In the illustrated sequence, the amplitudes of all illustrated pulses are arbitrarily chosen as unity (1).

Figures 6A, 6B, 9A, 9B:
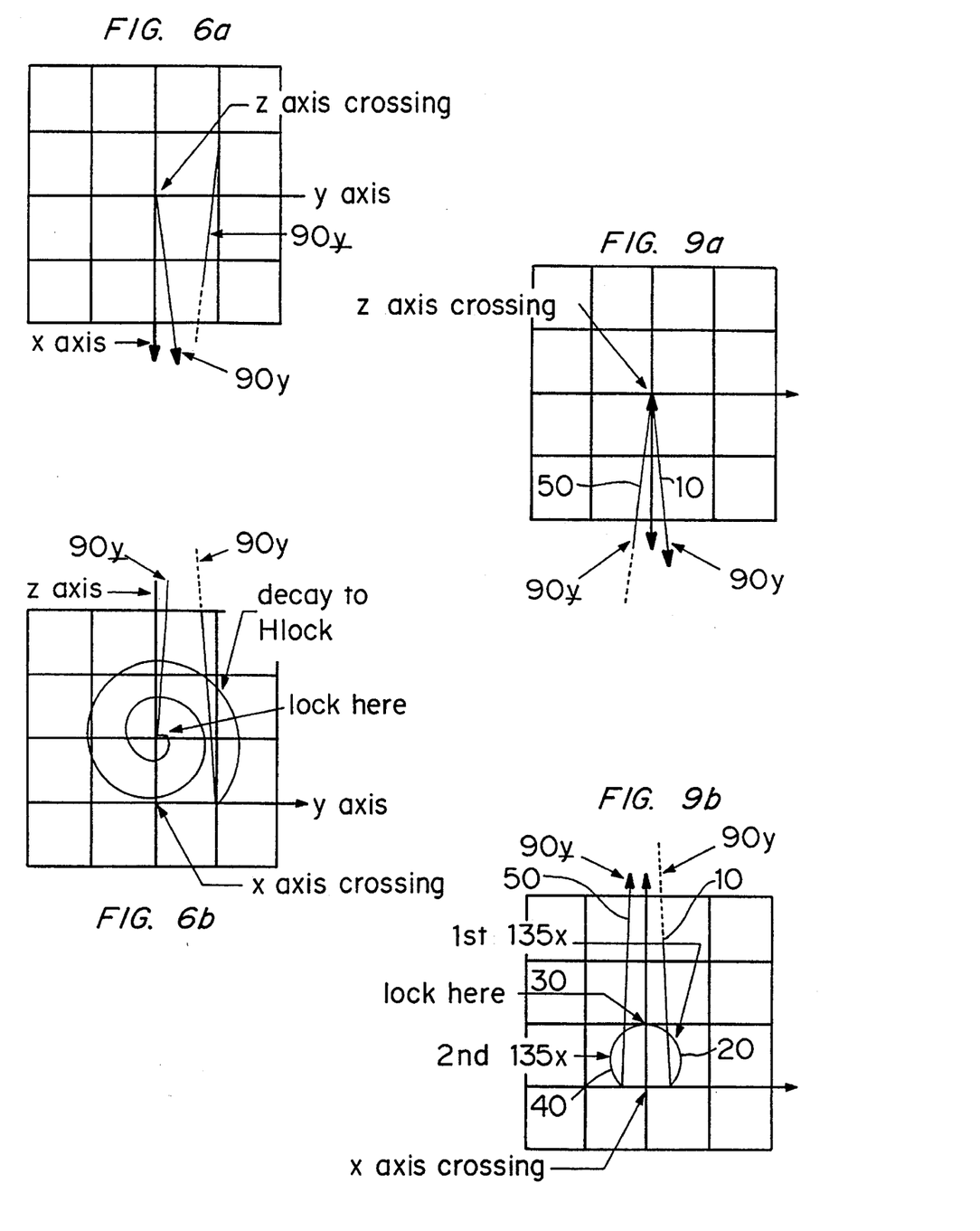
FIG. 6A shows a projection onto 2-space of a first superimposed grid of FIG. 6, taken from the point at which the z axis penetrates the unit sphere, the spacing of the grid chosen to correspond to an off-resonance component, $\epsilon$, of an applied effective field $H_{\it eff}$.
FIG. 6B shows a projection onto 2-space of a second superimposed grid of FIG. 6, taken from the point at which the x axis penetrates the unit sphere, the spacing of the grid chosen to correspond to an off-resonance component, ϵ, of an applied effective field $H_{eff}$.
FIG. 9A shows a projection onto 2-space of a first superimposed grid of FIG. 8, taken from the point at which the z axis penetrates the unit sphere, the spacing of the grid chosen to correspond to an off-resonance component, ϵ, of an applied effective field $H_{eff}$.
FIG. 9B shows a projection onto 2-space of a second superimposed grid of FIG. 8, taken from the point at which the x axis penetrates the unit sphere, the spacing of the grid chosen to correspond to an off-resonance component, ϵ, of an applied effective field $H_{eff}$.

One view of the effect on the magnetization of the pulse sequence illustrated in FIG. 4 is provided in FIG. 5 (macroscopic view) and in FIGS. 6A and 6B (microscopic view). The magnetization is assumed to be aligned along the z axis at t=0. On application of the 90° "flip down" pulse, the magnetization is swept down to the x-y plane. As a result of an off-resonance term, $\epsilon$, however, the magnetization does not lie along the x axis (as desired), but is offset by one grid unit, defined for convenience to be equal to $\epsilon$. (The value $\epsilon$ coincides with the spacing of the grids in all of FIGS. 5, 6A and 6B). The lock pulse is then applied in the x direction, along which axis the magnetization is believed to lie. In response to the lock pulse, the magnetization precesses about the x axis. The component of M perpendicular to x may be lost, M spiraling in to the x axis, in a time called $T_{2\rho}$, which may be more or less than the duration of the desired spin lock. Any remaining perpendicular component will likely be a nuisance because its direction at the end of the lock is unknown. The magnetization arrives at a point in the x-z plane that is offset by one unit ($\epsilon$) above the x axis. The magnetization is held at that position for the duration of the lock pulse, A 90° flip back pulse is then applied in an attempt to restore the magnetization to the z axis position. Characterized by the same offset term, however, the flip back pulse does not return the magnetization to this direction, but leaves it in a direction in which it intersects the unit sphere at a point one unit ($\epsilon$) to the right of the z axis and one unit past it, in the −x direction.

Figure 13:
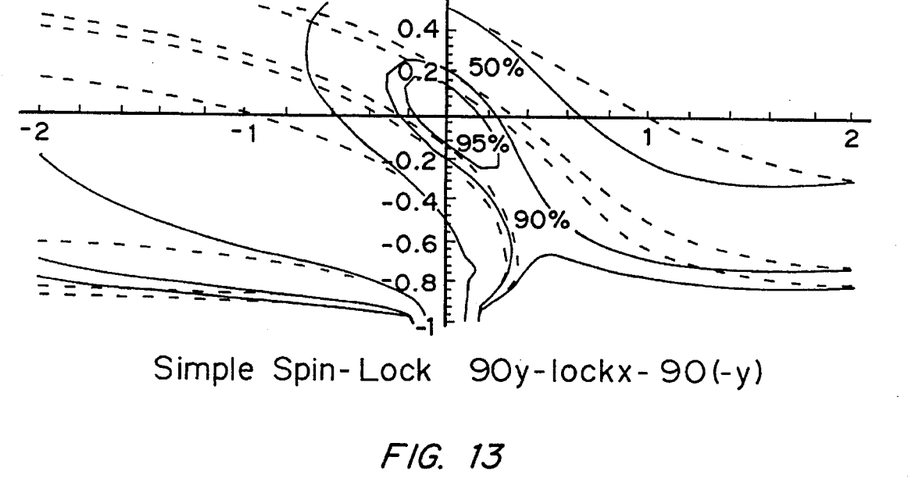
FIG. 13 is a plot of spin lock efficiency contours (solid contours) as a function of resonant frequency error (horizontal axis) and fractional RF strength error (vertical axis) for the known spin lock prepulse sequence shown in FIG. 4 (dotted contours covering the case in which 90° pulses are much stronger than the lock x pulse of FIG. 4).

The efficiency of this known spin lock approach is shown in FIG. 13, which plots contours for the fraction of original magnetization remaining after a pulse (no relaxation) along the z axis as a function of the error in RF strength (defined as a fraction of the nominal strength) (vertical scale) and of the resonant frequency error ($\epsilon$, horizontal scale). In FIG. 13, the solid contours are as described. The dotted contours describe the case in which the 90° pulses are much stronger than the lockx pulse in FIG. 4.

Although the significance of the plot of FIG. 13 will become more evident in the context of the discussion of the methods according to the present invention, a 95% efficiency region of the plot is rather tightly confined around the origin—where both types of error are at their lowest. Efficiency also falls off rather precipitately at higher error rates. The plot of FIG. 13 therefore indicates that spin lock efficiency using the above-described method is highly sensitive to both types of error. This sensitivity, particularly to resonant frequency error, gives rise to a variety of difficulties with NMR imaging and other applications, since spin lock inefficiency leads directly to loss of signal in whatever procedure is being performed.

SUMMARY OF THE INVENTION

The present invention overcomes the above-mentioned difficulties associated with prior art methods by providing a method for spin lock prepulsing of the magnetization of an object.

In brief, the methods according to the present invention place M in the x-z plane before locking. There, the phase of the required locking field is known despite off-resonance errors. Furthermore, the methods of the present invention incorporate the recognition that the amplitude of a 90° flip pulse, the amplitude and rotational displacement of a pulse to rotate the magnetization into the x-z plane, and the amplitude of the lock necessary to keep the magnetization at a value known in terms of the resonance offset, are mathematically related such that the selection of two of these values permits the calculation of the third and fourth. This, in turn, permits the selection of a wide variety of pulse sequences for locking magnetization at a particular position known in terms of the off-resonance component, $\epsilon$.

One embodiment of the present invention is an NMR RF pulse sequence for directing the magnetization of an object to a known position. An object lies in a magnetic field oriented along a first axis of a three axis frame. The RF pulse is applied perpendicularly to the magnetization and generates an effective field characterized by an off-resonance component. The pulse sequence comprises the following steps. First, a 90° flip pulse of the magnetization substantially about the effective field is applied, the effective field offset by the off-resonance component from a second axis that is perpendicular to the first, and that lies in a plane formed by the second and third axes. Second, at least one pulse is applied to flip the magnetization to a second direction lying in a plane perpendicular to the second axis. Third, at least one pulse is applied having sufficient amplitude to lock the magnetization in the direction arrived at in the second step.

Another embodiment of the present invention provides a method of NMR pulse sequencing for spin locking the magnetization of an object. The pulse sequence includes at least a first 90° flip of a first amplitude and about an effective field having an off-resonance component relative to a first axis, into a first plane defined by the first axis and a second axis. This first flip is followed by a second flip into a second plane defined by the second axis and a third axis, the second flip having a second amplitude and a second rotation. The second flip is followed by a modification in the pulse amplitude to rotate the pulse to align with and lock the magnetization in the second plane. This embodiment of the method according to the present invention includes the following steps. First a selection of two quantities is made from among a set including: the amplitude of the first pulse, the amplitude of the second pulse, the rotation of the second pulse and the amplitude of the lock pulse. Second, the two selected quantities are set to desired values. Third, values are computed, as a function of the two quantities selected in the first step, for the two quantities not selected in that step. Fourth, the magnetization of the object is spin locked using a pulse sequence having the values selected and computed in the first three steps.

These and other embodiments of the invention are set forth with specific examples in the Detailed Description of the Invention, below. All of the methods according to the present invention may be followed by additional steps, derivable from those method steps, to flip the magnetization back from the lock position to align with $H_0$.

According to the present invention, the prepulsing sequence can be designed to reduce the amplitude of the lock and thereby decrease the specific absorption rate ("SAR") and attendant patient heating associated with the pulse sequence.

A potentially infinite variety of families of pulse sequences can be generated in accordance with the teachings of the present invention. In addition to the embodiment described here for purposes of illustration, for example, the same approach can be used in sequences with windows, gaps or rests, or in which the pulse is replaced by two pulses of different amplitudes.

Even within a particular family of pulse sequences of the present invention, such as that of the illustrated embodiment, the invention gives rise to a virtually infinite number of variations in the manner in which the magnetization may be flipped into the x-z plane after having undergone a first 90° flip down. For instance, the second flip into the x-z plane may itself be a composite flip, including any sequence of flips that rotate the magnetization about axes in the x-z plane to place the magnetization in that plane in order to lock it there and in a position known in terms of the off-resonance component.

Accordingly, it is an object of the present invention to provide an improved approach to prepulse sequencing for compensating for spatial variations in the primary magnetic field of an NMR device, that lead to resonant frequency errors in NMR systems.

It is another object of the present invention to provide such prepulse sequences that can be inserted into most imaging pulse sequences.

It is yet another object of the present invention to provide a class of improved methods for achieving spin-lock in a $T_{1\rho}$ relaxation NMR technique.

It is still another object of the present invention to provide an improved approach for enhancing contrast in NMR images.

It is a further object of the present invention to provide an improved approach for enhancing contrast between any two different tissues in NMR images.

It is a further object of the present invention to provide an improved approach for enhancing contrast between blood and muscle in NMR images.

Still another object of the present invention is to provide an improved approach for spin-lock in medical applications of NMR with reduced patient heating.

DETAILED DESCRIPTION OF THE INVENTION

The present invention relies upon principles and improves upon methods that are set forth in the Background section of this document. For clarity, the present invention is described with respect to the dimensions of an abstract three dimensional space. The chosen axes of that space are merely illustrative and in no way limit the scope of the invention or the generality with which it may be applied. In addition, reference is made to a magnetization (also sometimes referred to as M), which characterizes any generalized subject lattice or object that may be under study. The invention is defined, and is accordingly described, in the rotating frame (which is discussed in the Background section of this document). Pulses of the present invention, such as the 90° y pulse discussed below, move the magnetization close to the x-y plane, provided the off-resonance component ϵ is small compared to the strength of the RF pulse $H_1$. Thus, unless otherwise indicated, references in this application to movements of the magnetization into the x-y plane or the x-z plane are intended to refer to moving the magnetization close to these planes (which occurs when ϵ is small compared to the magnitude of $H_1$). Similarly, rotation axes described as being about x or about y, for example, are intended to refer to rotations about effective fields close to such axes, provided that the pulse is close to resonance.

Figure 7:
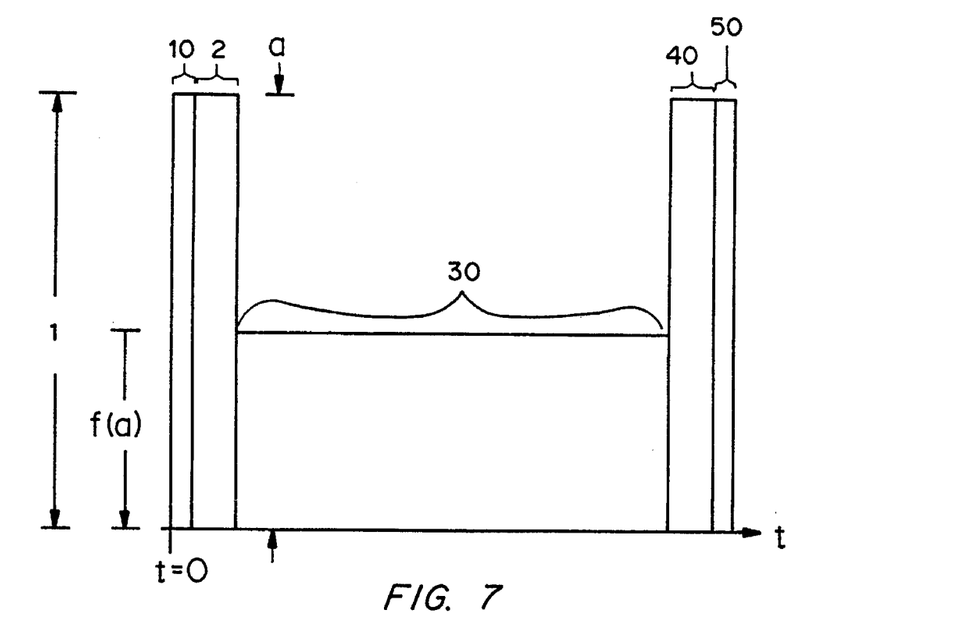
FIG. 7 shows an example of a spin-lock prepulse sequence according to the present invention.

A simple, illustrative embodiment of a prepulse sequence according to the present invention is provided in FIG. 7. A first 90° y flip pulse 10, assumed in this illustration to have an amplitude of 1, has a duration sufficient for that amplitude to effect a 90° flip of the magnetization. When flip pulse 10 is complete, a second, x flip pulse 20 (which could be implemented with a series of component pulses, as described below) is generated. The amplitude of this second flip pulse is defined as a. (Although amplitude 1 of y flip pulse 10 and amplitude a of the following x flip pulse are the same in FIG. 7, in general this is not necessary). After application of the second, x flip pulse 20, an x locking pulse 30 is applied for a desired period of time.

In addition to the foregoing flip down and lock, FIG. 7 also shows an optional flip back pulse sequence for returning the magnetization to the position it was in at t=0. This flip back is accomplished by pulses 40 and 50. An x flip back pulse 40, which has the same amplitude, duration and phase as the first x flip pulse 20, is applied. Then, a y flip back pulse 50, having the same amplitude and duration as first y flip down pulse 10, but 180° out of phase with the latter, is applied to return the magnetization to its orientation at t=0.

Figure 8:
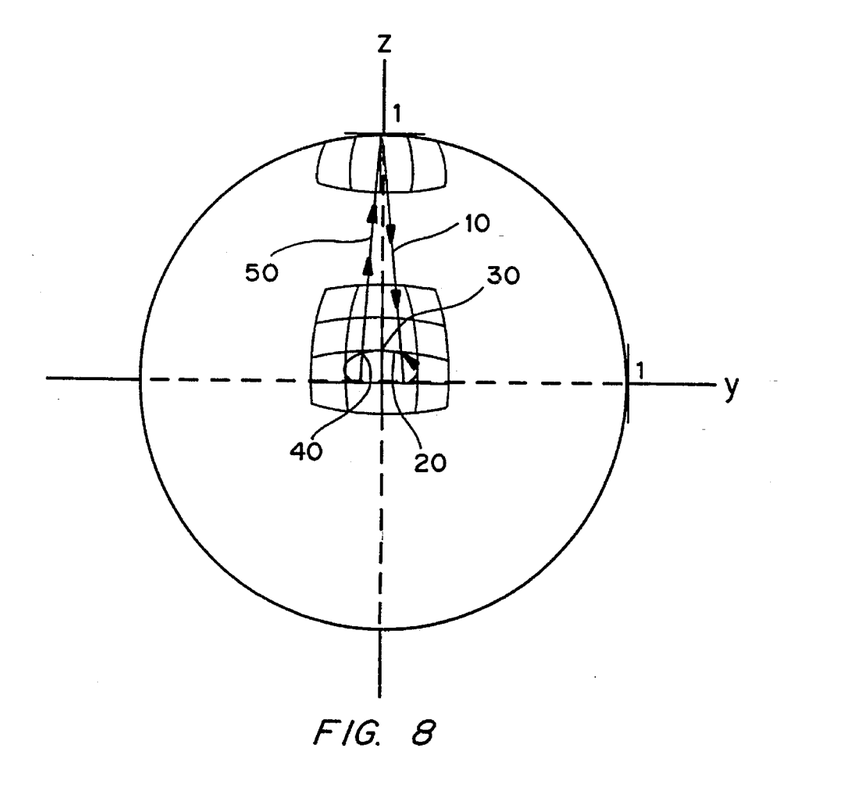
FIG. 8 shows a unit sphere as viewed along the x axis on which is visible the track of the trajectory of a magnetization under a spin-lock prepulse method, shown in FIG. 7, grids being superimposed at points of particular interest.

The effects of the prepulse sequence shown in FIG. 7 are illustrated in FIGS. 8, 9A and 9B. To facilitate comparison with the known spin lock prepulse sequence of FIG. 4, the same graphical techniques are used as with those used for the known sequence and its effects, as provided in FIGS. 5, 6A and 6B. In FIG. 8, the movement of the magnetization in response to the prepulse sequence defined in FIG. 7 is shown relative to a unit vector in 3-space. As seen in this macroscopic view, upon the application of pulse 10, the magnetization leaves the z axis (in which direction it is assumed to point at t=0), and sweeps down about $H_{eff}$, close to the y axis, and stops in the x-y plane. The magnetization then rotates into the x-z plane when pulse 20 is applied. There, it is locked by pulse 30, before again being rotated. Pulse 40 moves it back to the x-y plane. Finally, the magnetization is returned by pulse 50 to alignment with the z axis.

This method and its effects are illustrated in greater detail in FIGS. 9A and 9B. For purposes of illustration, but without limitation, the present pulse sequence (as set forth in FIG. 7) is configured such that the second pulse 20 (for moving the magnetization into the x-z plane) comprises a single pulse (rather than a composite including a plurality of pulses). Also without limitation, the amplitude of pulse 10 has been chosen as 1, and the amplitude of pulse 20 was also chosen to be 1. These parameters are most clearly illustrated in FIG. 7. By proper selection of units, the amplitude of pulse 10 (or any other single pulse) can be set to 1, simplifying description without loss of generality.

After application of 90° flip down pulse 10, the magnetization lies in the x-y plane, but is offset from the x axis by a fraction of the resonance offset, $\epsilon$. The flip angle necessary to rotate the magnetization from the x-y plane to the x-z plane for this case is 135°, given that the amplitude of the 90° flip pulse 10 and the second flip pulse 20 are both the same. The amplitude of the locking pulse 30 can be determined, according to the present invention, as a function of a, the amplitude of pulse 20. In the present case, the necessary amplitude of the locking pulse is approximately 0.414. At that amplitude, the direction of $H_{eff}$ during the locking pulse 30 lies in the x-z plane in the same direction as the magnetization.

Similarly, if and when it is desired to flip the magnetization back to its position at t=0, a pulse 40 of strength 1 for a duration sufficient for a rotation of the magnetization 135° about x returns the magnetization back to the x-y plane. The magnetization then lies in that plane, offset in the −y from the x axis to the same extent the magnetization was offset in the positive x direction following the initial 90° flip pulse 10.

Figure 10:
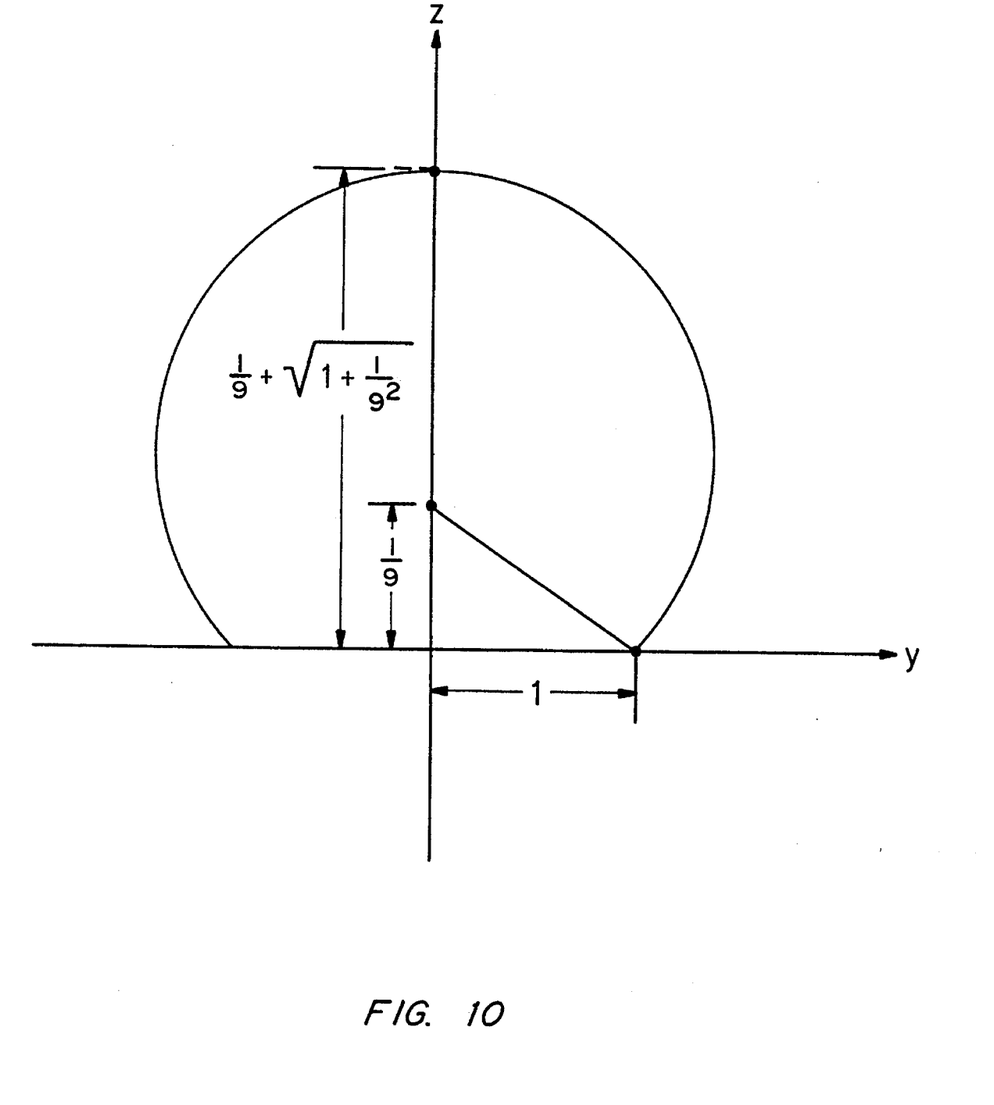
FIG. 10 shows certain geometric relations inherent in pulses according to the present invention, specifically those of the illustrated embodiment partially shown in FIG. 9B.

A formula characterizing the family of prepulse sequences of the type described above (one of an infinite number of such pulse sequences according to the present invention) is provided below in Table I and may be explained with reference to FIG. 10. FIG. 10 illustrates the geometric basis for the terms in Table I. The family of prepulse sequences specified by this formula includes (all such) sequences in which the second pulse is a single rather than a composite pulse, and that has no gaps or rests in the sequence. The formula provided in Table I is only one of a number of forms in which this relationship can be expressed.

TABLE I

| Pulse | Amplitude/Strength | Flip Angle |
| --- | --- | --- |
| 90° flip pulse | 1 | 90° |
| x-z plane alignment pulse | a | 180° − arctan a |
| lock pulse | $\dfrac{a}{1+\sqrt{1+a^2}}$ | any |

FIG. 10 shows the trajectory of M from the x-y plane after pulse 10, to the x-z plane following pulse 20. M precesses about $H_{eff}$, which is 1/a above the x axis if the pulse strength is a (all units of $\epsilon$).

The relationship in Table I may, for example, be rewritten with the lock pulse amplitude as the independent parameter, so that the x-z plane alignment pulse amplitude and flip angle can be chosen so as to select the locking pulse amplitude to have a low value and thus reduce SAR. In fact, the illustrated embodiment produces SAR that tends to produce near a minimum value. A pulse of 90y-122x-lockx-122x-90y might produce an even lower SAR than for the illustrated pulse sequence; however, the difference in SAR does not appear appreciable, and the sequence is somewhat more difficult to illustrate graphically than the 90y-135x-lockx-135x-90y pulse sequence shown in FIGS. 7, 8, 9A and 9B, 10, and 14.

Figure 11:
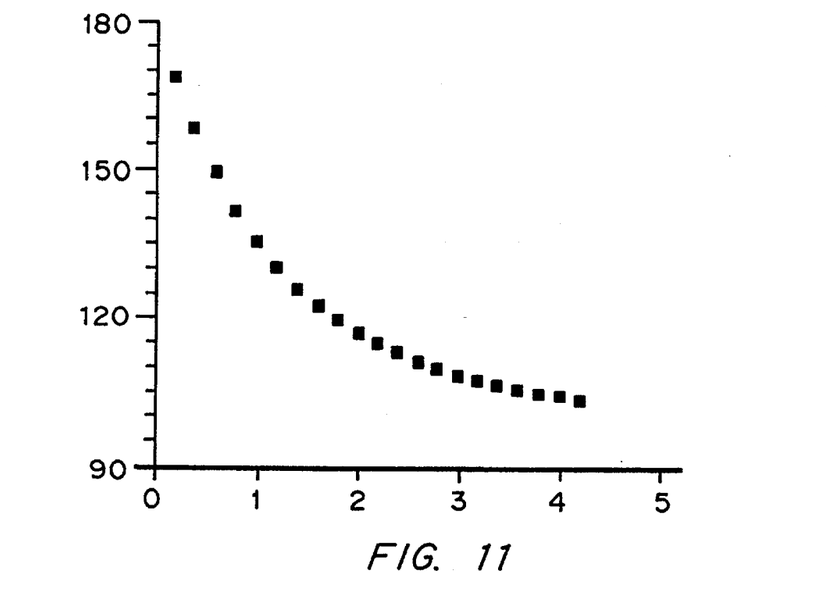
FIG. 11 is a plot, for a family of prepulse sequences according to the present invention, of the flip rotation required following a 90° flip down pulse to place the magnetization in the x-z plane as a function of the amplitude of the second flip pulse when the amplitude of the 90° flip pulse is unity.
Figure 12:
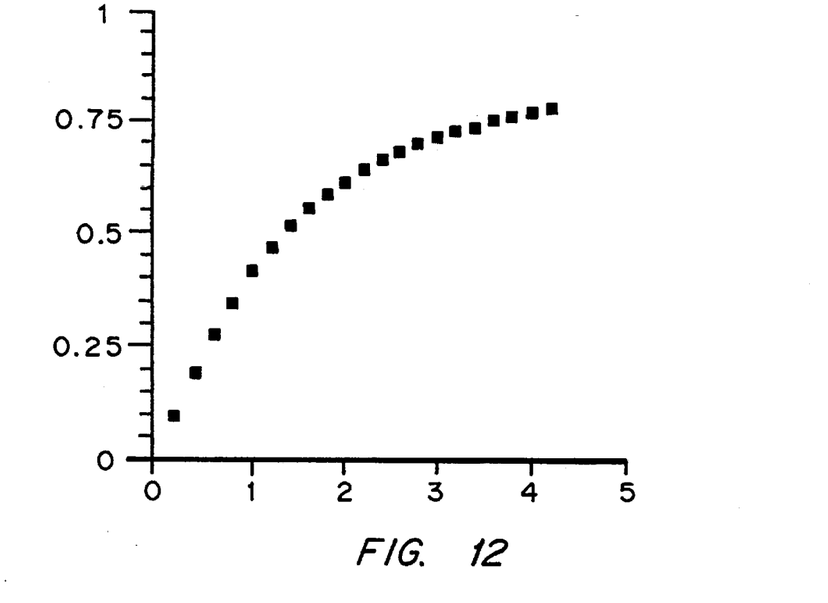
FIG. 12 is a plot, for a family of prepulse sequences according to the present invention, of the amplitude of the locking pulse required to lock the magnetization following the second flip, as a function of the amplitude of the second flip pulse when the amplitude of the 90 degree flip pulse is unity.

Plots for representative values of flip angle and lock strength as a function of the amplitude of the x-z plane alignment pulse 20, where the 90° flip pulse 10 is assumed to be of amplitude 1, are provided in FIGS. 11 and 12. The values themselves are provided in Table II.

| Amplitude a | Flip Angle | Lock Amplitude |
| --- | --- | --- |
| 0.2 | 168.690 | 0.09901 |
| 0.4 | 158.198 | 0.19258 |
| 0.6 | 149.036 | 0.27698 |
| 0.8 | 141,340 | 0.35078 |
| 1 | 135.00 | 0.41421 |
| 1.2 | 129.805 | 0.46837 |
| 1.4 | 125.537 | 0.51461 |
| 1.6 | 122.005 | 0.55424 |
| 1.8 | 119.054 | 0.58840 |
| 2 | 116.565 | 0.61803 |
| 2.2 | 114.443 | 0.64391 |
| 2.4 | 112.619 | 0.66666 |
| 2.6 | 111.037 | 0.68679 |
| 2.8 | 109.653 | 0.70471 |
| 3 | 108.434 | 0.72075 |
| 3.2 | 107.354 | 0.73519 |
| 3.4 | 106.389 | 0.74823 |
| 3.6 | 105.524 | 0.76008 |
| 3.8 | 104.743 | 0.77088 |
| 4 | 104.036 | 0.78077 |
| 4.2 | 103.392 | 0.78985 |

The above values are for a flip angle for pulse 20 given an amplitude for pulse 40 as shown in FIG. 7. To arrive at the member corresponding to the precise pulse sequence shown in FIG. 7, a is selected to be 1, while the amplitude of the 90° flip pulse has been assumed to be 1; this leads to a flip angle being 135° and a lock amplitude of 0.41421.

In FIG. 11, the flip angle necessary for rotating the magnetization into the x-z plane after the initial 90° flip pulse 10 is plotted as a function of the amplitude of pulse 20. In FIG. 12, the strength of the lock pulse 30 is plotted as a function of the amplitude of the x-z plane alignment pulse 20.

Figure 14:
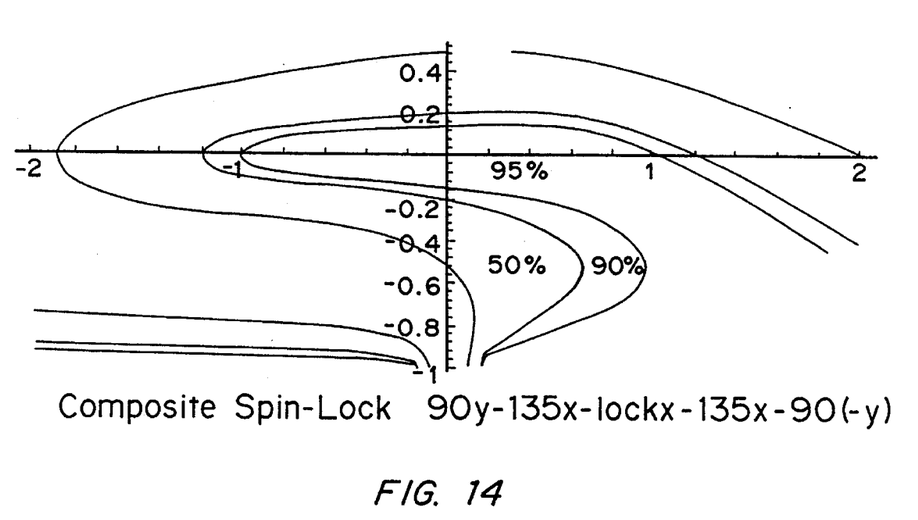
FIG. 14 is a plot of spin lock efficiency contours as a function of resonant frequency error (horizontal axis) and fractional RF strength error (vertical axis) for a spin lock prepulse sequence according to the present invention, shown in FIG. 7 (where the second pulse is 135° and the amplitudes of the first (90°) and the second (135°) degree pulses are the same).

The improvement in spin-lock efficiency attributable to the prepulse technique according to the present invention is illustrated in FIG. 14, and is particularly apparent when these results are compared against those of FIG. 13, in which the same quantities are plotted for the known spin-lock technique. In the Background section, the spin-lock efficiency for the known prepulse sequence 90y-lockx-90y was discussed. There, it was pointed out that the region of 95% spin lock efficiency, as a function of a resonant frequency error (horizontal axis) and fractional RF strength error (vertical axis), was narrowly confined. More specifically, 95% spin lock efficiency is achievable with the 90y-lockx-90y for resonant frequency errors with an absolute value no greater than approximately 0.2. A spin lock efficiency of 90% can be achieved for resonant frequency errors having an absolute value of not significantly greater than about 0.25, if fractional RF strength error is kept to an absolute value of no greater than about 0.2. Similarly, a spin lock efficiency of 50% can be achieved only for resonant frequency errors having an absolute value of less than about 1, if fractional RF strength error is kept to an absolute value no greater than about 0.2.

With the spin lock prepulsing method according to the present invention, by contrast, much greater resonant frequency errors can be tolerated. As shown in FIG. 12, for example, a 95% spin lock can be maintained, even if the absolute value of the resonant frequency error reaches about 1. For certain fractional RF strength errors, a 95% spin lock can be maintained for even greater values of the resonant frequency error. A 90% spin lock can be maintained in the presence of resonant frequency error having an absolute value of at least about 1.2, while a 50% spin lock can be maintained even for resonant frequency errors having an absolute value of approximately 2.

Other families of prepulse sequences according to the present invention in addition to the one shown in FIGS. 7, 8, 9A and 9B can be derived according to the principles described above. If, for example, the amplitude of the flip angle were to be different from 1, or if the x-z plane alignment of the magnetization following the 90° flip down pulse were to be accomplished using a plurality of component pulses, or if pulses and gaps were combined, an analogous mathematical relation can be readily determined according to the principles disclosed herein. The pulse sequence illustrated in FIGS. 7–9B could just as easily have shown any member of any of these families. All of these pulses place the magnetization M in the x-z plane before locking. There, the phase of the required locking field is known despite off-resonance errors.

As alluded to above, the second flip of the magnetization into the x-z plane, following the 90° flip, can be applied according to the present invention by a composite flip comprising any series of component pulses that ultimately rotate the magnetization about axes in the x-z plane to place the magnetization in that plane in order to lock it there and in a position known in terms of the resonance offset. A plurality of component pulses to flip the magnetization into the x-z plane may tend to increase SAR in certain circumstances, but it may nevertheless be capable of providing useful results. General illustration of these sequences is not possible, since they are infinite in number. However, another example helps illustrate this aspect of the invention.

Figure 15:
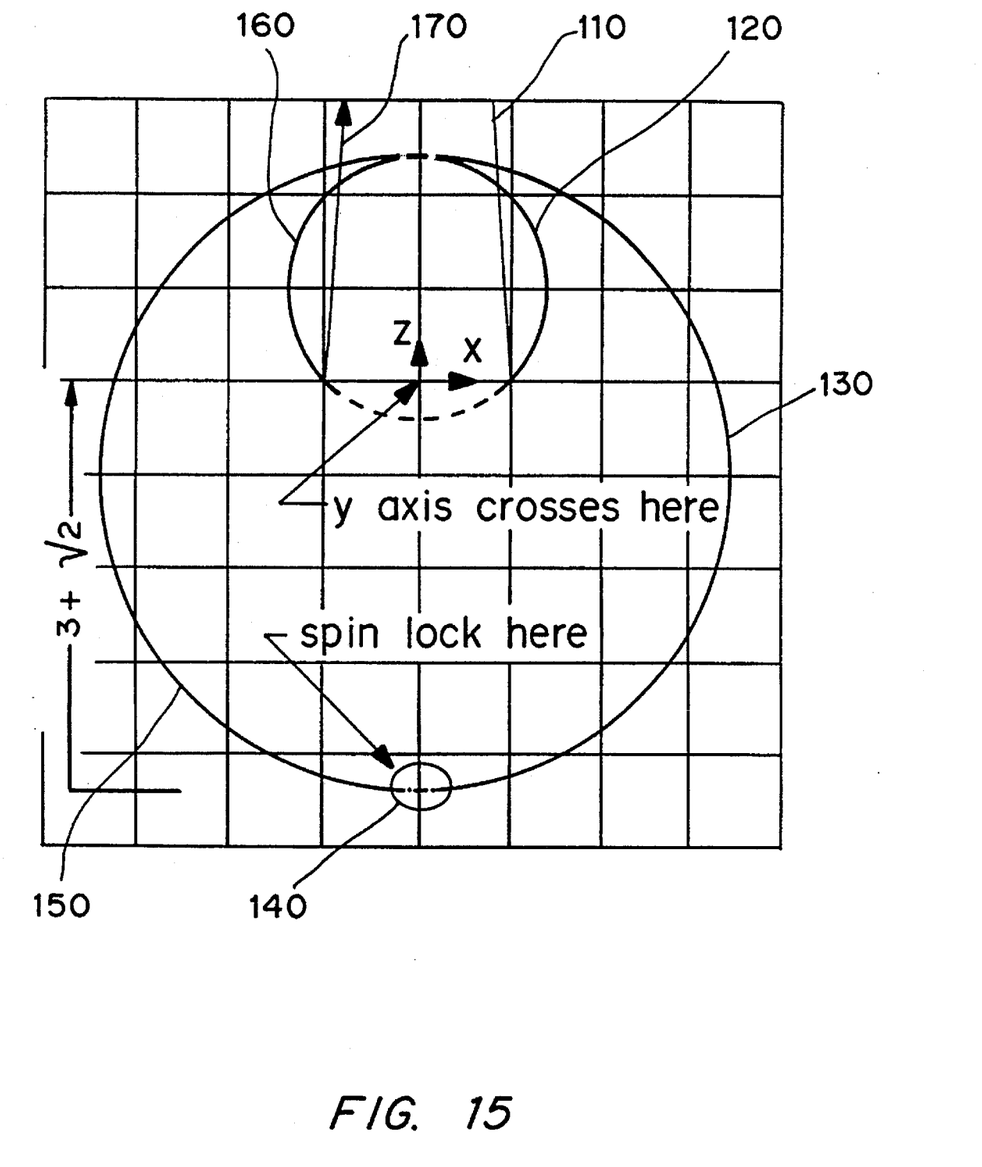
FIG. 15 shows a projection onto 2-space of a superimposed grid at the point at which the x axis penetrates the unit sphere, illustrating the trajectory of the magnetization under the effect of one member of a family of prepulse sequences according to the present invention, the prepulse sequence having a plurality of composite flips following the 90° flip down for rotating the magnetization into the x-z plane.

FIG. 15 shows (in the same form as the known spin-lock technique of FIG. 6B and the illustrative embodiment of FIG. 9B were shown) the trajectory of a magnetization vector under the influence of an alternative type of prepulse sequence according to the present invention near the x crossing of the unit sphere. That prepulse sequence is of the form:

90y-135x-180x-lockx-180x—135x-90y.

The rotations of the magnetization caused by this sequence in a system having an off resonance component ε are seen in FIG. 15 to be more complicated than the more straightforward 90y-135x-lockx-135x-90y sequence described above. Specifically, after the magnetization is rotated into the x-y plane by 90° y pulse 110, and a 135° x pulse 120 rotates it into the x-z plane, a third pulse 130 rotates the magnetization 180° (in the −x direction) to another point in the x-z plane below the x axis. Immediately after pulse 130, the magnetization is locked in position by an x pulse 140, where it may be held for a desired period of time. If and when it is desired to flip the magnetization to another desired direction, such as (without limitation) back to the z direction, further suitable pulses may be applied. To flip the magnetization back to the z direction, as shown in FIG. 15, a second 180° pulse is generated, bringing the magnetization to the point at which the 90y-135x-lockx-135-90y sequence locked. Another 135° rotation about X is applied by pulse 160, which permits a second 90° pulse, this one 180° out of phase with the first, to return the magnetization to the z direction (in which direction it had pointed at t=0). Other flip pulses could just as easily be applied after the −z spin lock of the 90y-135x-180x-lockx-180x—135x-90 y sequence. For instance, one could flip the magnetization following spin lock to any one of a number of directions, including but not limited to the x-y plane, the −z axis, or other directions.

The spin lock prepulse sequence illustrated in FIG. 15 demonstrates a second family of pulse sequences according to the present invention, in which multiple pulses are used to move the magnetization from the x-y plane into a desired position in the x-z plane.

Although the method according to the present invention has been illustrated for a particular embodiment, and with reference to a second, that invention is not limited to either embodiment. Rather, the disclosed principles may just as easily be embodied not only by other prepulse sequences, but also by other families of pulses that employ the above-described principles, such as moving to the x-z plane a plurality of times, or leaving gaps in the pulse sequence, or changing the amplitude once or a plurality of times during a pulse. In addition, the methods described above are symmetrical with respect to choice of x or y axis, or any other axes 90° apart from each other and in the x-y plane. That is, although the methods were described as beginning with a flip down about the y axis and subsequent alignment in the x-z plane, the methods can be performed with equal facility with a flip down about the x axis, with alignment of the magnetization in the y-z plane.

What is claimed is:

1. An NMR RF pulse sequence for directing the magnetization of an object to a known position, the object in a magnetic field oriented along a first axis of a three axis frame, the RF pulse perpendicular to the magnetization and generating an effective field characterized by an off-resonance component, the pulse sequence comprising the steps of:

(1) applying a 90° flip pulse of the magnetization substantially about the effective field, the effective field offset by the off-resonance component from a second axis, perpendicular to the first;

(2) applying at least one pulse to flip the magnetization to a second direction lying in a plane perpendicular to the second axis; and (3) applying at least one pulse of an amplitude sufficient to lock the magnetization in the direction arrived at in step (2).

2. The pulse sequence according to claim 1, wherein the pulse of step (1) has a first amplitude and the pulse of step (2) has a second amplitude, the flip angle of at least one of the at least one pulse of step (2) and the amplitude of the pulse of step (3) being a function of the amplitudes of the pulses of steps (1) and (2).

3. The pulse sequence according to claim 1, wherein the at least one pulse of step (2) is a single pulse.

4. The pulse sequence according to claim 1, wherein the at least one pulse of step (2) is a composite pulse.

5. The method of claim 1, further comprising the step of incorporating steps (1)–(3) into a preexisting pulse sequence.

6. A method of NMR pulse sequencing for spin locking the magnetization of an object, the pulse sequence including at least a first 90 degree flip of a first amplitude and about an effective field having an off-resonance component relative to a first axis into a first plane defined by the first axis and a second axis, followed by a second flip into a second plane defined by the second axis and a third axis, the second flip having a second amplitude and a second rotation, followed by a modification in the pulse amplitude to rotate the pulse to align with and lock the magnetization in the second plane, the method comprising the steps of:

(1) selecting from among the amplitude of the first pulse, the amplitude of the second pulse the rotation of the second pulse and the amplitude of the lock pulse, two of these quantities;

(2) setting the two selected quantities to desired values;

(3) computing values, as a function of the two quantities selected in step (2), for the two quantities not selected in that step; and (4) spin locking the magnetization of the object using a pulse sequence having the values selected and computed in steps (1), (2) and (3).

7. The method of claim 6, further comprising the step of incorporating steps (1)–(4) into a preexisting pulse sequence.

8. The method of claim 6, wherein the amplitudes of the first and second pulses are selected in step (1) and the values for the rotation of the second pulse and the amplitude of the lock pulse are computed as functions of the amplitudes of the first and second pulses.

9. The method of claim 8, wherein the amplitude of the first pulse is set equal to the off-resonance and the amplitude of the second pulse is set equal to an amplitude a, the rotation of the second pulse being computed according to the expression (180°-arctan(a)) and the amplitude of the lock pulse being computed according to the expression:

$$\frac{a}{1+\sqrt{1+a^2}}.$$

10. The method of claim 8, wherein the amplitude of the first pulse is set equal to the off-resonance, and the amplitude of the second pulse is set equal to the amplitude of the first pulse, the rotation of the second pulse being 135° and the amplitude of the lock pulse being approximately 0.414.

11. The method of claim 6, wherein the rotation of the second pulse and the amplitude of the lock pulse are selected in step (1) and the amplitudes of the first and second pulses are determined as functions of the values selected in step (1).

12. A method for spin locking a magnetization of an object, the object being in a three dimensional space defined by first second and third axes, the method using a nuclear magnetic resonance device capable of generating a field $H_0$ in the direction of the first axis, along which the magnetization of the object is initially aligned, and further capable of generating a field $H_1$ in pulses to produce an effective magnetic field $H_{eff}$, the effective magnetic field being characterized by an off-resonant component, pulses of $H_1$ being capable of flipping and otherwise rotating the magnetization of the object, the method comprising the steps of:

(1) flipping the magnetization substantially 90° about the effective field, the effective field offset by the off-resonance component from the second axis, the flipping being performed by a first $H_1$ pulse of a known amplitude, to place the magnetization in a first plane formed by the second and third axes;

(2) selecting an amplitude for a second $H_1$ pulse along the third axis for rotating the magnetization into a second plane formed by the first and third axes;

(3) flipping the magnetization into the second plane with the second $H_1$ pulse; and (4) modifying the amplitude of $H_1$ to align the effective field with the magnetization and lock it in its position.

13. The method of claim 12, wherein the lock amplitude of step (4) is determined by the amplitude of the pulse of step 1 and the amplitude of the pulse of step 2.

14. The method of claim 13, wherein the amplitude of the pulse of step 1 is 1, and the amplitude of the pulse of step 2 is a, the amplitude of the lock pulse being given by the relation:

$$\frac{a}{1+\sqrt{1+a^2}}.$$

15. The method of claim 12, further comprising the step of incorporating steps (1)–(4) into a preexisting pulse sequence.

16. The method of claim 12, further including a composite flip-back pulse, comprising the steps of:

(5) modifying the amplitude of $H_1$ to that of the second pulse;

(6) rotating the magnetization out of the second and back into alignment with the effective field, offset from the first plane by the off-resonance component; and (7) flipping back the magnetization substantially 90° with a pulse of an amplitude substantially equal to that of the first pulse to return the magnetization back in the direction of the first axis.

17. The method of claim 16, further comprising the step of incorporating steps (1)–(7) into a preexisting pulse sequence.

18. A method for spin locking a magnetization of an object, the object being in a three dimensional space defined by first second and third axes, the method using a nuclear magnetic resonance device capable of generating a field $H_0$ in the direction of the first axis, along which the magnetization of the object is initially aligned, and further capable of generating a field $H_1$ in pulses to produce an effective magnetic field $H_{eff}$, the effective magnetic field being characterized by an off-resonance component, pulses of $H_1$ being capable of flipping and otherwise rotating the magnetization of the object, the method comprising the steps of:

(1) selecting an amplitude for a flip pulse of $H_1$ to rotate the magnetization 90° about the effective field, the effective field being offset by the off-resonance component from the second axis and from a first plane determined by the second and third axes;

(2) selecting an amplitude for a spin lock pulse of $H_1$;

(3) performing a 90° flip into the first plane about the effective field using the flip pulse of $H_1$ selected in step (1);

(4) selecting an amplitude for a pulse to flip the magnetization into a second plane perpendicular to the first and determined by the first and third axes, the amplitude based on the amplitudes selected in steps (1) and (2);

(5) applying a pulse having the amplitude selected in step (4) to rotate the magnetization into the second plane; and (6) adjusting the amplitude of $H_1$ following the rotation of step (5) to the amplitude selected in step (2);

whereby the magnetization is locked in a known position.

19. A method for spin locking a magnetization of an object, the object being in a three dimensional space defined by first, second and third axes, the method using a nuclear magnetic resonance device capable of generating a field $H_0$ in the direction of the first axis, along which the magnetization of the object is initially aligned, and further capable of generating a field $H_1$ in pulses to produce an effective magnetic field $H_{eff}$, the effective magnetic field being characterized by an off-resonant component, pulses of $H_1$ being capable of flipping and otherwise rotating the magnetization of the object, the method comprising the steps of:

(1) selecting an amplitude for a first flip pulse of $H_1$ to rotate the magnetization 90° about the effective field, the effective field being offset by the off-resonance component from the second axis and from a first plane determined by the second and third axes:

(2) selecting an amplitude for a second flip pulse of $H_1$ to rotate the magnetization into a second plane determined by the first and third axes;

(3) performing a 90° flip of the magnetization about the effective field using the flip pulse of $H_1$ selected in step (1);

(4) performing a flip of the magnetization into the second plane using a pulse of $H_1$, the rotation of the flip determined by the amplitudes of the first and second pulses of $H_1$; and (5) adjusting the amplitude of $H_1$ to lock the magnetization following the flip of step (4), the adjustment being to an amplitude determined by the amplitudes of the first and second pulses of $H_1$;

whereby the magnetization is locked in a known position.

20. A composite flip down pulse method for aligning the magnetization of an object along a particular locking field in 3-space characterizable by mutually orthogonal directions x, y and z, wherein the object is in a first magnetic field $H_0$ oriented in the z direction of the space, and in which a device for producing magnetic fields is adapted to generate an RF field $H_1$, having an off-resonance component that is small in comparison the RF field, the method comprising the steps of:

(1) generating a first $H_1$ pulse in a preselected direction Y and having a preselected amplitude, the first $H_1$ pulse for rotating the magnetization of the object about the effective field, offset by the off-resonance component from the direction Y, whereby the magnetization is flipped to a first direction in the x-y plane;

(2) generating at least one second $H_1$ pulse to rotate the magnetization to a second direction in the x-z plane and having a position known in terms of said off resonance component; and (3) modifying the amplitude of $H_1$ to rotate the effective field $H_{eff}$ in the x-z plane to the particular locking field direction and thereby locking the magnetization of the object in that direction.

21. The method of claim 20, wherein the amplitude of $H_1$ to rotate the effective field $H_{eff}$ is given by the relation:

$$\frac{a}{1+\sqrt{1+a^2}}$$

where a is the amplitude of the first $H_1$ pulse.

22. The method of claim 21, wherein the amplitude of the first and second pulses are equal to the off-resonance, the rotation of the magnetization by the second pulse is 135° and the amplitude of the lock is 0.414 the value of the amplitudes of the first and second pulses.

23. The method of claim 20, further including a flip-back pulse comprising the steps of:

(4) modifying the amplitude of $H_1$ to rotate the effective field $H_{eff}$ out of the x-z plane and back into the y-z plane to rotate magnetization of the object into that plane;

(5) generating at least one further $H_1$ pulse to rotate the magnetization to a third direction, in the x-y plane, and having a position known in terms of said off-resonance component; and (6) generating a final $H_1$ pulse in a preselected direction Y and having a preselected amplitude, the first $H_l$ pulse for rotating the magnetization of the object about the effective field, whereby the magnetization is flipped to align substantially with the z direction.

* * * * *

UNITED STATES PATENT AND TRADEMARK OFFICE
CERTIFICATE OF CORRECTION

PATENT NO. : 5,614,826
DATED : March 25, 1997
INVENTOR(S) : W. Thomas Dixon

It is certified that error appears in the above-indentified patent and that said Letters Patent is hereby corrected as shown below:

Column 2, line 3 insert --$u_2$-- after $u_1$.

Signed and Sealed this

Twenty-first Day of April, 1998

Attest:

BRUCE LEHMAN

Attesting Officer

Commissioner of Patents and Trademarks